(12) United States Patent
Thompson et al.

(10) Patent No.: US 10,770,634 B1
(45) Date of Patent: Sep. 8, 2020

(54) REFLECTORS HAVING OVERALL MESA SHAPES

(71) Applicant: Facebook Technologies, LLC, Menlo Park, CA (US)

(72) Inventors: Daniel Bryce Thompson, Cork (IE); James Small, Langbank (GB)

(73) Assignee: FACEBOOK TECHNOLOGIES, LLC, Menlo Park, CA (US)

( * ) Notice: Subject to any disclaimer, the term of this patent is extended or adjusted under 35 U.S.C. 154(b) by 0 days.

(21) Appl. No.: 16/379,426

(22) Filed: Apr. 9, 2019

(51) Int. Cl.
| H01L 33/60 | (2010.01) |
| H01L 21/02 | (2006.01) |
| H01L 33/24 | (2010.01) |
| H01L 33/14 | (2010.01) |
| H01L 29/06 | (2006.01) |
| H01L 33/28 | (2010.01) |

(52) U.S. Cl.
CPC ........ H01L 33/60 (2013.01); H01L 21/02104 (2013.01); H01L 33/14 (2013.01); H01L 33/24 (2013.01); H01L 29/0619 (2013.01); H01L 29/0661 (2013.01); H01L 33/28 (2013.01)

(58) Field of Classification Search
CPC ......... H01L 33/60; H01L 33/20; H01L 33/62; H01L 33/54; H01L 33/58; H01L 29/0619; H01L 29/74; H01L 29/0661
USPC ..... 257/98, 99, 170, 586; 258/22, 26, 27, 29
See application file for complete search history.

(56) References Cited

U.S. PATENT DOCUMENTS

| 9,887,319 B2 | 2/2018 | Bonar | |
| 2016/0126422 A1* | 5/2016 | Jeon | ........................ H01L 33/46 257/98 |

* cited by examiner

*Primary Examiner* — Thinh T Nguyen
(74) *Attorney, Agent, or Firm* — Weaver Austin Villeneuve & Sampson LLP (57) ABSTRACT

Disclosed are techniques related to reflectors having overall mesa shapes. Such a reflector may be formed over an overall mesa-shaped, layered structure of an apparatus for emitting light. The overall mesa-shaped, layered structure may comprise a mesa complement structure, a first-type doped semiconductor, a light emission layer, and a second-type doped semiconductor arranged in layers. Thus, the reflector may be configured to collimate light that emits from the light emission layer and reaches the reflector through the mesa complement structure.

20 Claims, 10 Drawing Sheets

REFLECTORS HAVING OVERALL MESA SHAPES

BACKGROUND

The disclosure relates generally to optoelectronics, and more specifically to reflectors having overall mesa shapes.

Semiconductors have become popular components of optical devices for various reasons, especially their efficiency. For example, in contrast to an incandescent light bulb, a light-emitting diode (LED) converts proportionately more energy into light instead of heat. Nevertheless, much research is focused on further increasing the efficiency of semiconductor devices, particularly as miniaturization often involves a trade-off between size and light flux.

SUMMARY

This disclosure relates to reflectors having overall mesa shapes. Such a reflector may be formed over an overall mesa-shaped, layered structure of an apparatus for emitting light. The overall mesa-shaped, layered structure may comprise a mesa complement structure, a first-type doped semiconductor, a light emission layer, and a second-type doped semiconductor arranged in layers. Thus, the reflector may be configured to collimate light that emits from the light emission layer and reaches the reflector through the mesa complement structure.

In some embodiments, the overall mesa-shaped, layered structure may have a curved mesa shape, such as a paraboloid shape. In some embodiments, the overall mesa-shaped, layered structure may comprise a truncated mesa-shaped, layered structure that is augmented with the mesa complement structure to form the overall mesa-shaped, layered structure. The truncated mesa-shaped, layered structure may comprise the first-type doped semiconductor, the light emission layer, and the second-type doped semiconductor. Thus, the mesa complement structure, the first-type doped semiconductor, the light emission layer, and the second-type doped semiconductor may be etched together to form the overall mesa-shaped, layered structure.

In some embodiments, the mesa complement structure may comprise a transparent dielectric material. For example, the transparent dielectric material may be a silicon oxide or a silicon nitride material.

In some embodiments, the reflector may comprise multiple layers of dielectric material. In some embodiments, the reflector may comprise a layer of aluminum or silver.

In some embodiments, the apparatus for emitting light may further comprise an electrical contact and an interconnect. The electrical contact may be positioned at a surface of the first-type doped semiconductor, and the interconnect may connect the electrical contact to the reflector.

In some embodiments, the light emission layer may comprise a III-Nitride semiconductor material. In some other embodiments, the light emission layer may comprise an aluminum indium gallium phosphide semiconductor material.

BRIEF DESCRIPTION OF THE DRAWINGS

Illustrative embodiments are described with reference to the following figures.

The figures depict embodiments of the present disclosure for purposes of illustration only. One skilled in the art will readily recognize from the following description that alternative embodiments of the structures and methods illustrated may be employed without departing from the principles, or benefits touted, of this disclosure.

DETAILED DESCRIPTION

In the following description, for the purposes of explanation, specific details are set forth in order to provide a thorough understanding of certain inventive embodiments. However, it will be apparent that various embodiments may be practiced without these specific details. The figures and description are not intended to be restrictive.

Disclosed herein are techniques that enable increased efficiency of optical devices (e.g., LEDs and/or photodiodes). The increased efficiency may be based on light collimation. As used herein, light is referred to as "collimated" when its component rays are directed such that they are parallel or quasi-parallel to each other.

To enable light collimation, semiconductor devices may be formed into truncated "mesa" shapes that leverage internal reflection to collimate light. Examples of mesa shapes include, without limitation, curved mesa shapes (e.g., paraboloid shapes) and non-curved mesa shapes (e.g., conic shapes). Accordingly, examples of truncated mesa shapes include, without limitation, a truncated paraboloid and a truncated cone. The truncated characteristic of a mesa shape provides a flat surface for accommodating an electrical contact.

Furthermore, to collimate any light that would otherwise escape through the surfaces of the truncated mesa shapes, reflectors may be formed over the truncated mesa shapes. However, reflectors having truncated mesa shapes are sub-optimal for collimation.

Thus, to provide a flat surface for accommodating an electrical contact without suffering from the drawbacks of a reflector having a truncated mesa shape, a reflector may be formed to exhibit an "overall" mesa shape instead of a truncated mesa shape. An overall mesa shape may be similar to a non-truncated mesa shape (e.g., a non-truncated paraboloid or a non-truncated cone). However, an overall mesa shape may differ from a non-truncated mesa shape in that an overall mesa shape may exhibit a number of imperfections. For example, an overall mesa shape may not have a perfect paraboloid shape or a perfect cone shape, because there may be a hole in the overall mesa shape for accommodating an electrical connection. As will be described in greater detail below, the hole may enable access to a flat surface for accommodating an electrical contact.

Compared to a reflector having a truncated mesa shape, a reflector having an overall mesa shape enables superior collimation of light. More specifically, an overall mesa shape enables collimation of light that may otherwise have been scattered by a truncated mesa shape.

Although the embodiments below are described in the context of light-emitting devices, it should be appreciated that the embodiments below are equally applicable to light-harvesting devices. For example, an augmented reflector can be used to collimate more emitted light and/or to focus more received light.

Devices with Truncated Mesa-Shaped Reflectors

Figure 1:
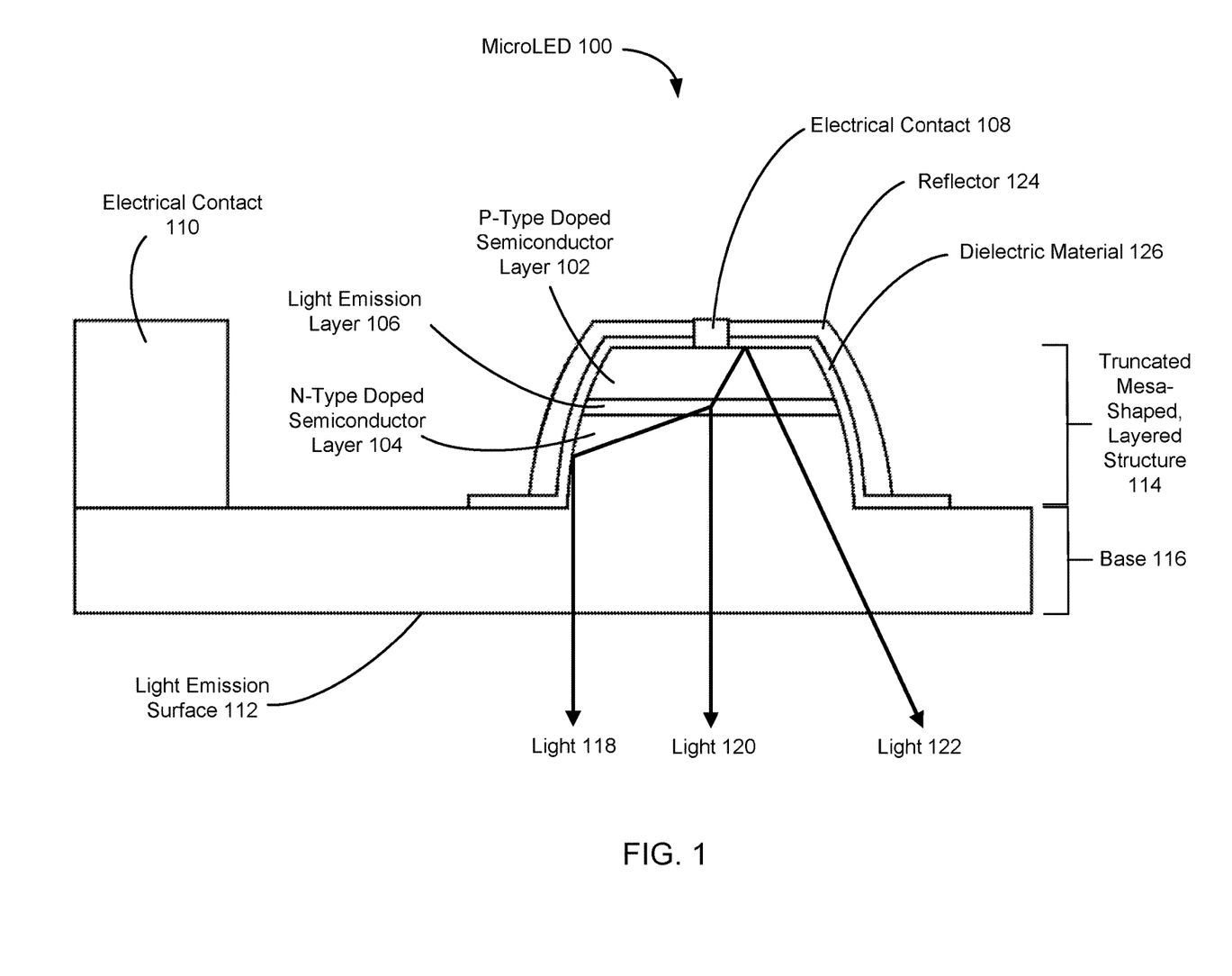
FIG. 1 illustrates an example semiconductor device having a truncated mesa shape.

Referring to FIG. 1, a cross-sectional view of an example microLED 100 is provided. As used herein, a "microLED" may refer to an LED that has an active light-emitting area with a linear dimension that is less than 50 µm, less than 20 µm, or less than 10 µm. The linear dimension may be as small as 2 µm or 4 µm. For example, their small size enables a display system to have a single pixel having contributions from three such LEDs: a red microLED, a green microLED, and a blue microLED. Their small size also enables microLEDs to be lightweight, making them particularly suitable for use in wearable display systems, such as watches and computing glasses.

The microLED 100 may be an inorganic LED that includes, among other components, a layered semiconductor device comprising different layers of semiconductor material. In the example of FIG. 1, the layered semiconductor device comprises semiconductor layers 102 and 104 that sandwich a light emission layer 106. Although FIG. 1 illustrates the semiconductor layer 102 as corresponding to a p-type doped semiconductor layer and illustrates the semiconductor layer 104 as corresponding to an n-type doped semiconductor layer, in some other embodiments, the semiconductor layer 102 may correspond to an n-type doped semiconductor layer, and the semiconductor layer 104 may correspond to a p-type doped semiconductor layer.

The layered semiconductor device may comprise layers of III-V semiconductors. A III-V semiconductor may comprise one or more Group III elements, such as aluminum (Al); gallium (Ga); and/or indium (In), in combination with a Group V element, such as nitrogen (N); phosphorus (P); arsenic (As); or antimony (Sb).

In some embodiments, the layered semiconductor device may comprise one or more layers of III-Nitride semiconductors. For example, the light emission layer 106 may be a layer of InGaN that is situated between a layer of p-type GaN doped with magnesium and a layer of n-type GaN doped with silicon or oxygen. InGaN LEDs can produce green, blue, and white colors.

In some other embodiments, the layered semiconductor device may comprise one or more layers of AlInGaP semiconductors. For example, the light emission layer 106 may be a layer of AlInGaP that is situated between a layer of p-type AlInGaP doped with zinc or magnesium and a layer of n-type AlInGaP doped with selenium, silicon, or tellurium. AlInGaP LEDs can produce red, orange, and yellow colors.

The layered semiconductor device may comprise an epitaxial layered structure grown using techniques such as Molecular Beam Epitaxy (MBE) or Metalorganic Chemical Vapor Deposition (MOCVD). For example, the semiconductor layer 104 may be grown on a fabrication substrate (e.g., a glass, sapphire, GaAs, GaP, GaN, or silicon substrate). Thereafter, the light emission layer 106 may be grown on the semiconductor layer 104, and the semiconductor layer 102 may be grown on the light emission layer 106. In some embodiments, one or more other layers, such as a p++ semiconductor layer, may also be grown.

In the example of FIG. 1, the semiconductor layers 102 and 104 are operatively coupled to electrical contacts 108 and 110, respectively. The electrical contacts 108 and 110 are typically composed of a conductive material, such as gold and/or some other metal(s), that facilitates the flow of electrical current through the layered semiconductor device. Furthermore, to combat the flow of electrical current outside the layered semiconductor device, a dielectric material 126 may cover at least part of the layered semiconductor device.

In the example of FIG. 1, the electrical contacts 108 and 110 are both located on surfaces of the layered semiconductor device that are opposite to a light emission surface 112. Thus, the electrical contacts 108 and 110 can support the microLED 100 when it is mounted on a substrate that includes a control circuit. However, in some other embodiments, electrical contacts can be located on opposite surfaces of a layered semiconductor device.

When a voltage is applied across the electrical contacts 108 and 110, one or more quantum wells of the light emission layer 106 may output light. For example, FIG. 1 illustrates light 120 emitted from the light emission layer 106 in a direction that is perpendicular to the light emission surface 112. However, the light emission layer 106 can also emit light in any number of other directions, which may cause the light to be trapped within the layered semiconductor device or to be transmitted through the light emission surface 112 in a scattered fashion.

Thus, for superior light extraction, at least part of the layered semiconductor device may be formed into a truncated mesa shape. For example, the layered semiconductor device of FIG. 1 comprises a truncated mesa-shaped, layered structure 114 and a base 116. In the example of FIG. 1, the truncated mesa-shaped, layered structure 114 is a truncated paraboloid having the light emission layer 106 positioned at an approximate focal point. This configuration enables collimation of light 118 based on reflecting the light 118 off the inner walls of the truncated mesa-shaped, layered structure 114.

Additionally, the microLED 100 may comprise a reflector 124 that further increases light extraction. The reflector 124 may conform to the truncated mesa-shaped, layered structure 114 to enable collimation of light that would otherwise escape through the walls of the truncated mesa-shaped, layered structure 114.

Significantly, the truncated characteristic of the mesa shape provides a flat surface for accommodating an electrical contact. In the example of FIG. 1, the truncated mesa-shaped, layered structure 114 accommodates the electrical contact 108 where the top part of a non-truncated paraboloid (e.g., the part comprising the vertex of the non-truncated paraboloid) may otherwise have been located. However, light reflected from this flat surface may be trapped within the layered semiconductor device or transmitted through the light emission surface 112 in a scattered fashion. For example, FIG. 1 illustrates light 122 reflected from the flat surface at an angle that enables the light 122 to avoid collimation.

The microLED 100 may include one or more other components, such as a lens, a waveguide, and/or a transparent substrate attached to the layered semiconductor device at the light emission surface 112. However, to avoid unnecessarily obscuring the disclosure, such components are not illustrated.

Devices with Overall Mesa-Shaped Reflectors

Figure 2:
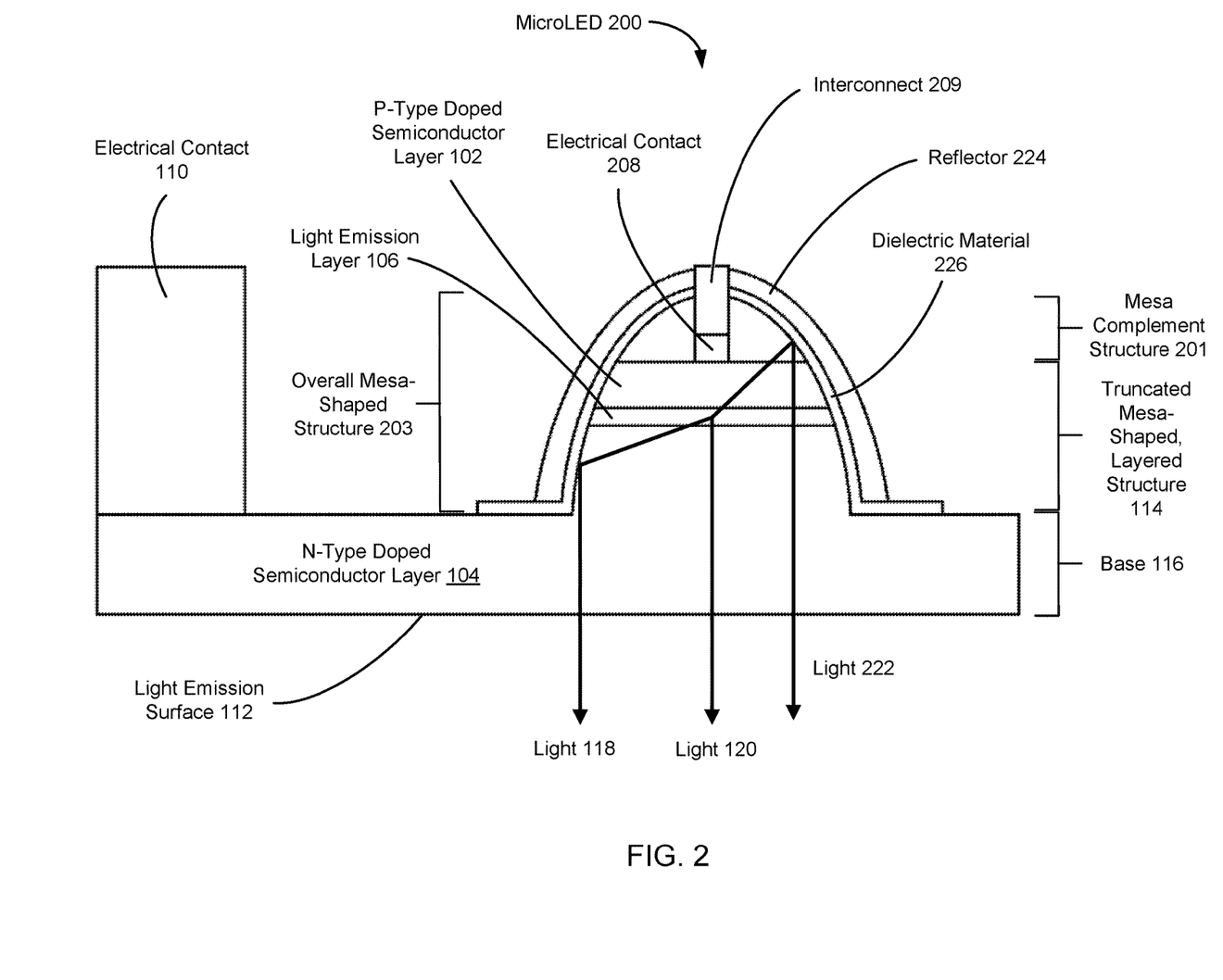
FIG. 2 illustrates an example semiconductor device having an overall mesa shape.

FIG. 2 provides a cross-sectional view of an example microLED 200 that addresses some of the shortcomings of the microLED 100 of FIG. 1. Although the microLED 200 may be similar to the microLED 100, among other differences, the microLED 200 comprises a reflector 224 having an overall mesa shape instead of a truncated mesa shape. In contrast to the truncated mesa shape of the reflector 124 of FIG. 1, the overall mesa shape of the reflector 224 of FIG. 2 enables superior light extraction. For example, unlike the light 122 reflected from the reflector 124 of FIG. 1, light 222 reflected from the reflector 224 of FIG. 2 is collimated instead of scattered.

The overall mesa shape of the reflector 224 may be formed by conforming the reflector 224 to the shape of an underlying structure that exhibits an overall mesa shape. In the example of FIG. 2, the underlying structure corresponds to an overall mesa-shaped, layered structure 203 that comprises the truncated mesa-shaped, layered structure 114 and a mesa complement structure 201. The mesa complement structure 201 may serve as a support structure on which one or more reflective and/or metallic layers can be deposited to form the overall mesa shape of the reflector 224. This is why the reflector 124 of FIG. 1, in which there is no mesa complement structure, exhibits a truncated mesa shape instead of an overall mesa shape. Stated differently, the overall mesa shape may be formed based on augmenting the truncated mesa-shaped, layered structure 114 with the mesa complement structure 201, which is not part of the layered semiconductor device. Although the mesa complement structure 201 is illustrated in FIG. 2 as a dome top structure, it should be appreciated that the mesa complement structure 201 can alternatively correspond to a shape comprising the apex/vertex of a cone or to some other shape that complements the truncated mesa-shaped, layered structure 114 to collectively form an overall mesa shape.

In some other embodiments, the overall mesa-shaped, layered structure 203 may comprise a layered semiconductor device that exhibits an overall mesa shape by itself, thereby making augmentation unnecessary. Stated differently, at least part of the layered semiconductor device may be formed into an overall mesa shape instead of a truncated mesa shape. In such embodiments, the semiconductor layer 102 may be thicker to enable positioning the light emission layer 106 at an approximate focal point of the overall mesa shape. However, for some III-V semiconductors, growing the semiconductor layer 102 to be thick may be problematic, especially if the semiconductor layer 102 is to be a p-type layer. For example, if the semiconductor layer 102 is too thick, it may be difficult to have light emission that appears to originate from a point source, because electrons may not travel in a direct path toward the center of the light emission layer 106. Thus, the remainder of this disclosure will focus on embodiments in which a truncated mesa shape is augmented.

Referring to FIG. 2, in accordance with various embodiments, the mesa complement structure 201 is a dome top structure composed of a transparent material that enables light from the truncated mesa-shaped, layered structure 114 to reach the reflector 224 via the mesa complement structure 201. As used herein, the term "transparent" refers to the quality of being transparent or quasi-transparent (e.g., enabling light to pass through albeit potentially with some refraction). In some embodiments, the mesa complement structure 201 may be composed of a material having a refractive index similar to that of the semiconductor layer 102. Additionally or alternatively, the mesa complement structure 201 may be composed of a dielectric material. Additionally or alternatively, the mesa complement structure 201 may be composed of a hard etchable material that will not deform or become separated from the layered semiconductor device under typical operating conditions. For example, the mesa complement structure 201 may be composed of silicon or a silicon compound, such as a silicon oxide (SiOx) or a silicon nitride (SiNx) material.

FIG. 2 illustrates an embodiment in which dielectric material 226 is situated between the reflector 224 and the overall mesa-shaped, layered structure 203. However, in some other embodiments, the dielectric material 226 may be integrated into the reflector 224. In such other embodiments, the reflector 224 may comprise multiple layers of material. For example, the reflector 224 may be a distributed Bragg reflector that comprises multiple layers of dielectric material, including a layer of the dielectric material 226.

In some embodiments, the reflector 224 may comprise a layer of material that exhibits both conductive and reflective properties. For example, the reflector 224 may comprise a layer of aluminum (Al) or silver (Ag) that interfaces with the dielectric material 226. In such embodiments, the reflector 224 may be electrically connected to an electrical contact 208 via an interconnect 209.

The electrical contact 208 and the interconnect 209 may each be composed of a conductive material (e.g., gold and/or one or more other metals) that enables them to collectively perform a role similar to that of the electrical contact 108 in FIG. 1. However, for reasons that will become apparent in the description accompanying FIG. 5, they are illustrated as distinct components of the microLED 200.

Formation of Overall Mesa-Shaped, Layered Structures

As mentioned above, the reflector 224 may conform to the overall mesa-shaped, layered structure 203 comprising at least part of a layered semiconductor device. In some embodiments, the overall mesa-shaped, layered structure 203 may be formed based on one or more etching techniques, such as dry etching, wet etching, or combinations thereof. Etching is typically performed using a mask to control how a layered semiconductor device is shaped. More specifically, the mask has a shape that is identical or similar to the desired shape of the layered semiconductor device. In some embodiments, the mask shape is identical to the desired shape of the layered semiconductor device. In some embodiments, the mask shape exhibits a predictable variance from the desired shape of the layered semiconductor device (e.g., differences between the shapes can be modeled by a print transfer function such that the function can be used to form a desired shape based on a mask shape that is not identical to the desired shape).

For example, FIGS. 3A-E illustrate an approach for using one or more dry etching techniques to form an overall mesa-shaped, layered structure comprising at least part of a layered semiconductor device. Examples of dry etching techniques include, without limitation, Radio Frequency (RF) oxygen plasma etching, reactive ion etching (ME), and inductively coupled plasma (ICP) etching. Although FIGS. 3A-E illustrate the formation of a single overall mesa-shaped, layered structure, it should be appreciated that the approach illustrated in FIGS. 3A-E can be used to concurrently form any number of overall mesa-shaped, layered structures.

Figure 3A:
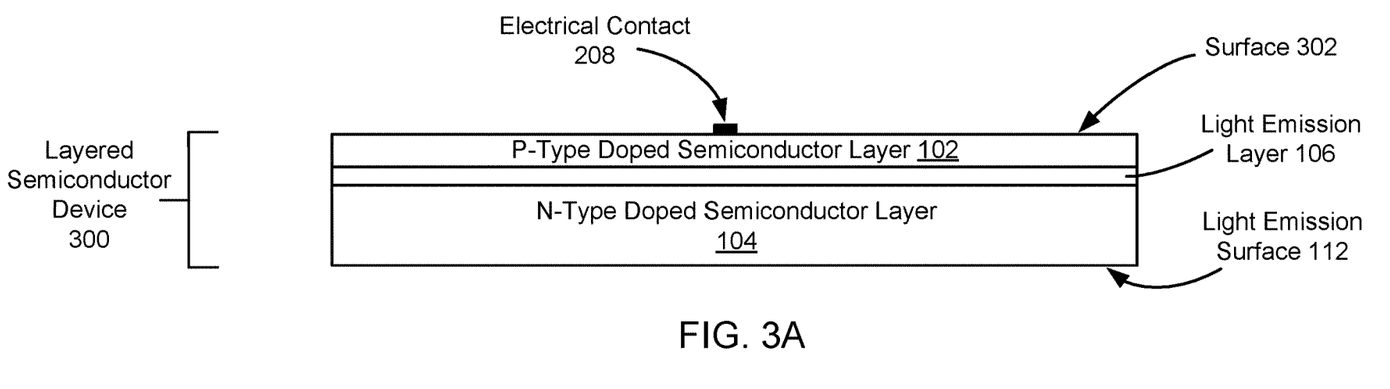
FIGS. 3A-E illustrate an example approach for forming etch masks that complement truncated mesa shapes to form overall mesa shapes.

For reasons that will become apparent in the description accompanying FIG. 5, some embodiments involve forming the electrical contact 208 prior to performing any etching. Referring to FIG. 3A, the electrical contact 208 may be positioned at a surface 302 of a layered semiconductor device 300. In the example of FIG. 3A, the layered semiconductor device 300 comprises the semiconductor layers 102 and 104 as well as the light emission layer 106. In some embodiments, the surface 302 may be opposite to what is to become the light emission surface 112. As will become apparent in FIG. 3E, in such embodiments, the surface 302 comprises the flat surface of the truncated mesa-shaped, layered structure that will accommodate the electrical contact 208.

Figure 3B:
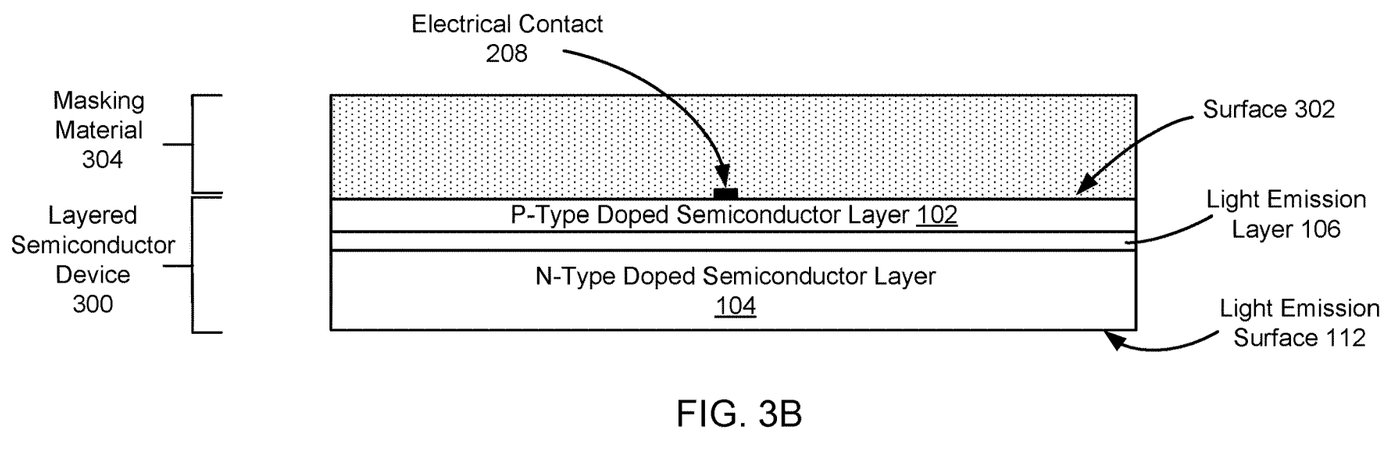

Referring to FIG. 3B, a layer of a masking material 304 may be applied to the surface 302 and the electrical contact 208. As will become apparent in FIG. 3E, the mesa complement structure 201 will be formed from the masking material 304. Thus, in some embodiments, the masking material 304 may be composed of a SiOx or a SiNx material. For example, the masking material 304 may be silicon dioxide.

To form a mesa shape in the masking material 304, any of various sacrificial materials may be formed into a shape that is similar or identical to the desired mesa shape. Thereafter, the shape of the sacrificial material may be transferred to the masking material 304 based on an etching technique. Examples of such sacrificial materials include, without limitation, an elastomer or some other polymer that can be cured based on exposure to heat or light (e.g., ultraviolet light).

Figure 3C:
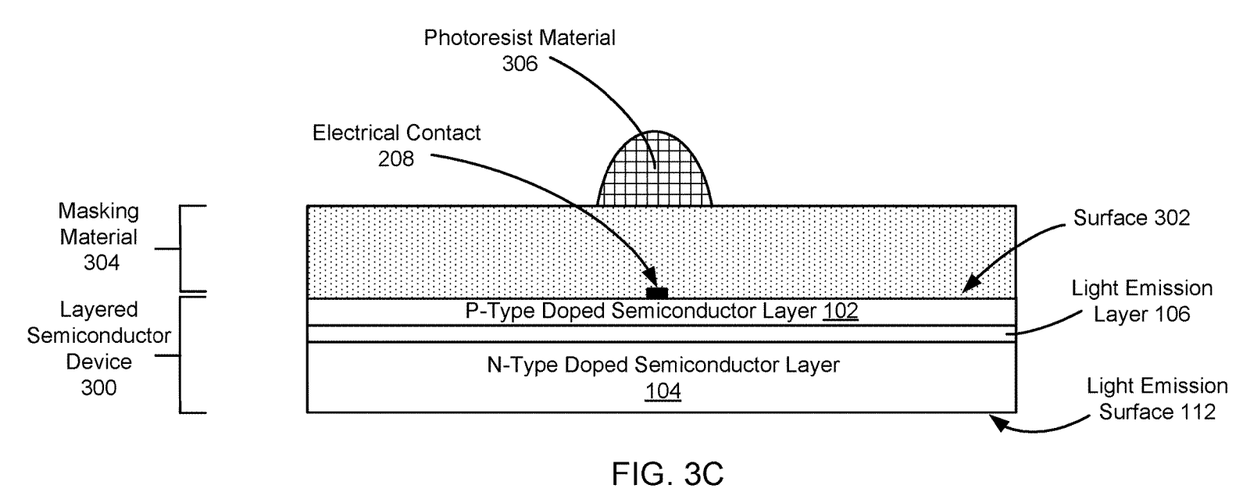

FIG. 3C illustrates an embodiment in which the sacrificial material is a photoresist material 306. The photoresist material 306 may be applied to a surface of the masking material 304 and formed into a mesa shape using any of various techniques. In some embodiments, the photoresist material 304 may be applied as a droplet that is thermally reflowed into a mesa shape. In some other embodiments, the photoresist material 304 may be applied as a layer of pliable material that is shaped based on pressing a mold against it. Upon forming the photoresist material 306 into a mesa shape, the photoresist material 306 may be cured.

Figure 3D:
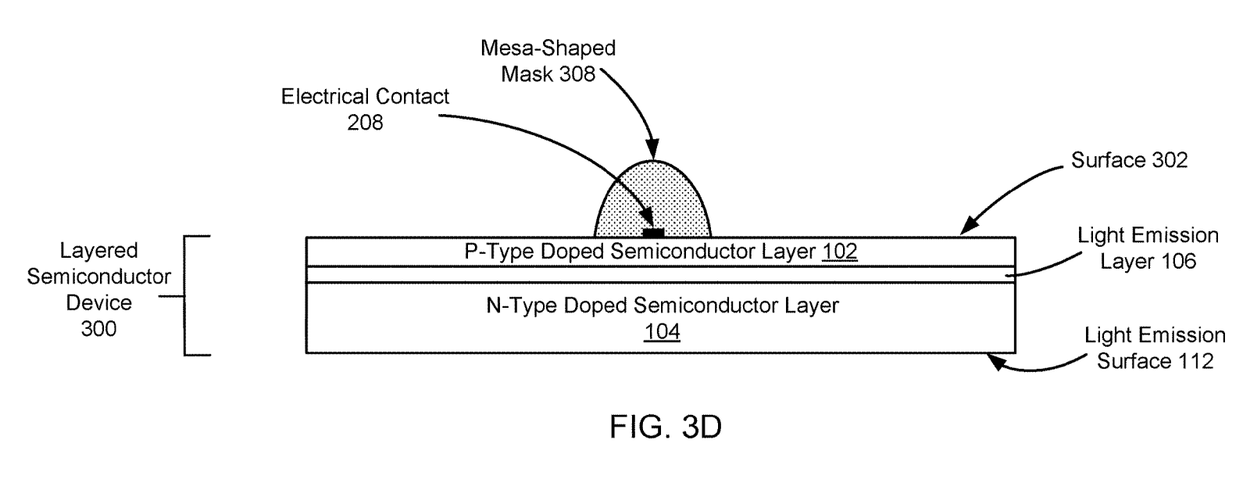

The mesa-shaped sacrificial material and the masking material 304 may then be subjected to an etching process that completely erodes the sacrificial material to form a similar or identical mesa shape in the masking material 304. FIG. 3D illustrates a mesa-shaped mask 308 that is formed at the surface 302 based on using an etching technique is to transfer the mesa shape of the photoresist material 306 to the masking material 304. The etching technique may involve, for example, an anisotropic dry etch using hydrogen fluoride vapor.

Figure 3E:
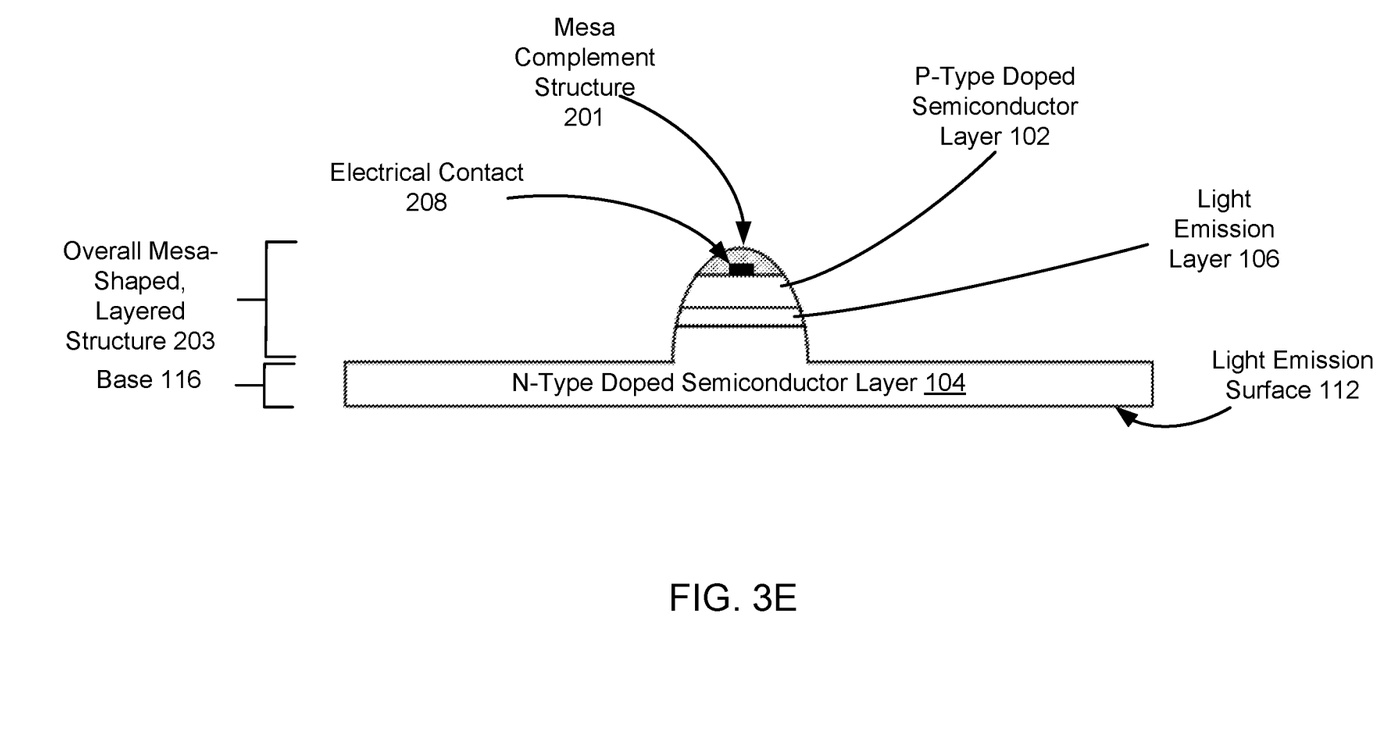

In turn, the mesa-shaped mask 308 may be used to etch a similar or identical mesa shape comprising part of the layered semiconductor device 300. More specifically, the mesa-shaped mask 308 and the layered semiconductor device 300 may be etched together (e.g., simultaneously formed by a single etch process/procedure) to form the overall mesa-shaped, layered structure 203. Significantly, however, the masking material 304 is not completely eroded. Referring to FIG. 3E, the remaining part of the masking material 304 corresponds to the dome top shape of the mesa complement structure 201. Thus, the remaining part of the masking material 304 may be used to augment the truncated mesa-shaped, layered structure comprising part of the layered semiconductor device 300, thereby forming the overall mesa-shaped, layered structure 203. Any of various etching techniques may be used to form the overall mesa-shaped, layered structure 203, including the same etching technique described above for forming the mesa-shaped mask 308.

Formation of Overall Mesa-Shaped Reflectors

Upon forming the overall mesa-shaped, layered structure 203, the reflector 224 may be shaped to conform to the overall mesa-shaped, layered structure 203. As described in greater detail below, this may involve applying multiple layers of material to the overall mesa-shaped, layered structure 203.

Figure 4:
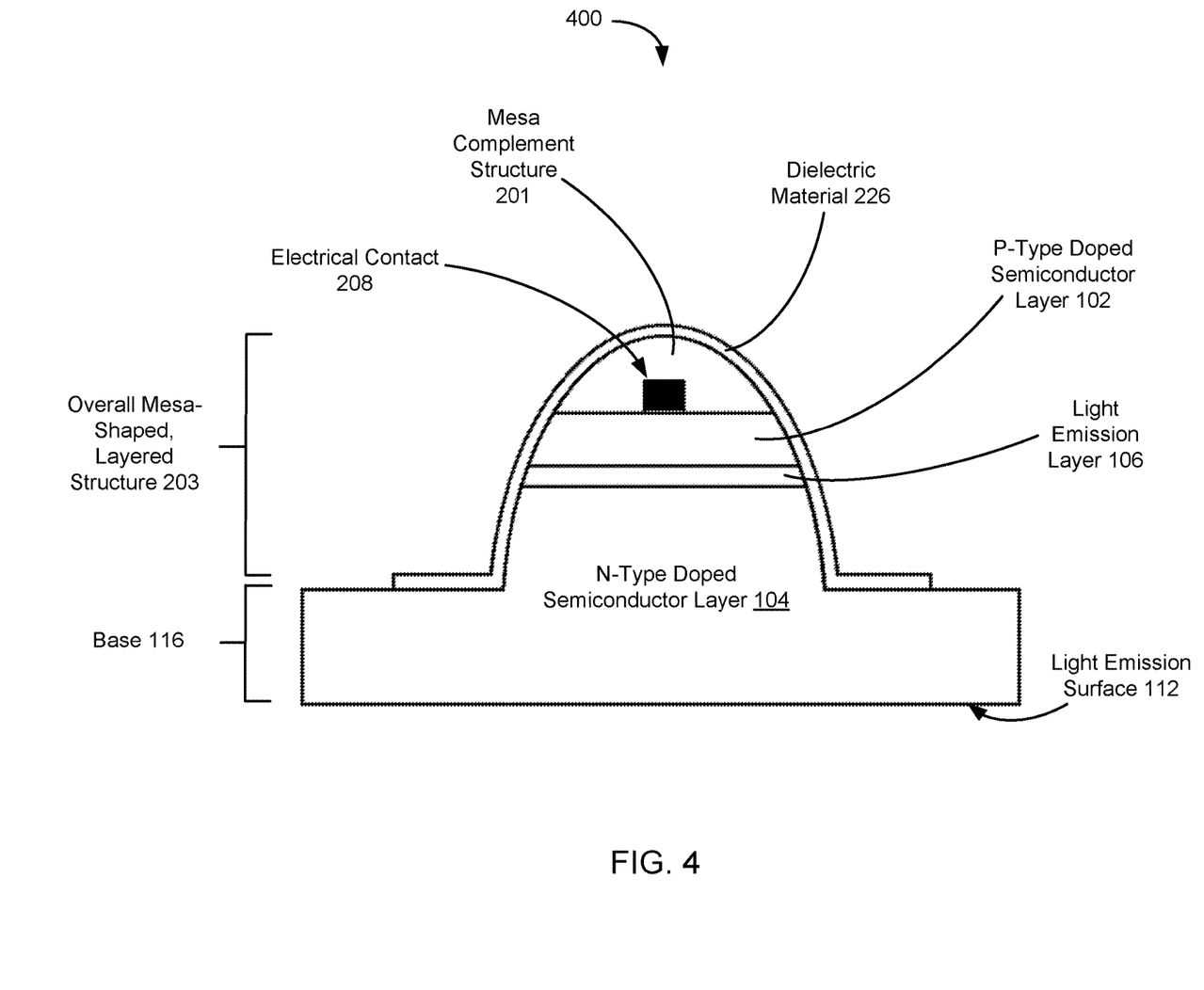
FIG. 4 illustrates an enlarged view of an example overall mesa-shaped, layered structure having dielectric material deposited thereon.

For the sake of clarity, FIG. 4 provides a view 400 that enables details of the overall mesa-shaped, layered structure 203 to be easily discerned. In particular, FIG. 4 illustrates the electrical contact 208 as being positioned along the longitudinal axis of the overall mesa-shaped, layered structure 203. This position also corresponds to the longitudinally thickest region of the dome top shape of the mesa complement structure 201. Thus, it may be difficult for electrical current to access the electrical contact 208, particularly if the mesa complement structure 201 is composed of a dielectric material.

Additionally, one or more layers of dielectric material may be applied to the overall mesa-shaped, layered structure 203. FIG. 4 illustrates an embodiment in which the dielectric material 226 is deposited over the overall mesa-shaped, layered structure 203, thereby forming a mesa-shaped layer of dielectric material. As mentioned above, this layer may be separate from the reflector 224 or this layer may be integrated into the reflector 224. For example, one or more layers of dielectric material may be subsequently applied to the dielectric material 226 layer to form a distributed Bragg reflector.

Figure 5A:
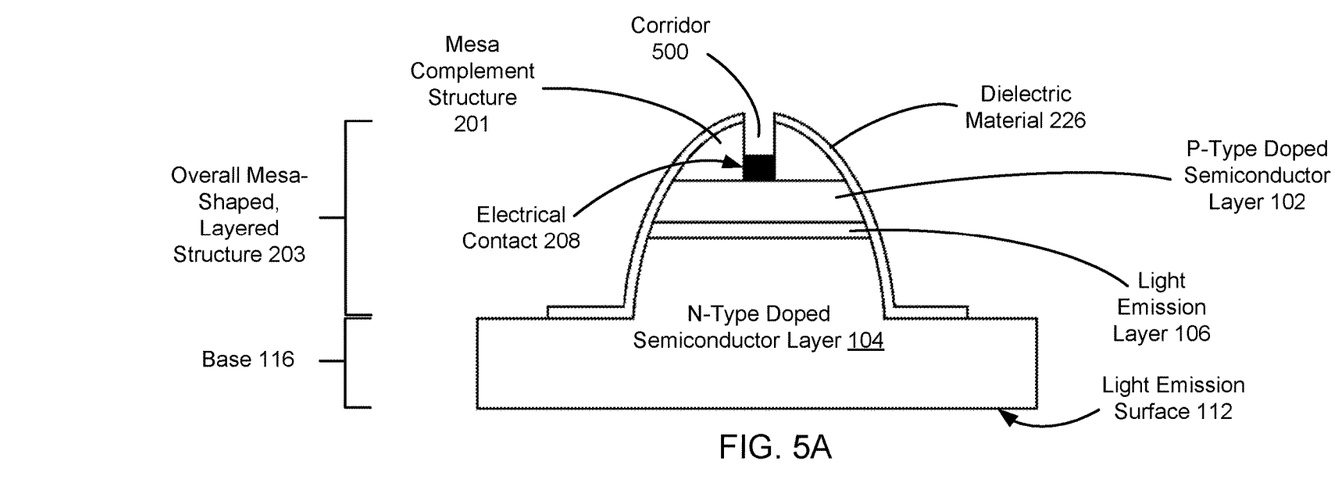
FIGS. 5A-B illustrate an example approach for forming a reflector that conforms to an overall mesa-shaped, layered structure.

Accordingly, in some embodiments, access to the electrical contact 208 may be enabled based on removing some of the dielectric material 226 and some of the mesa complement structure 201. For example, FIG. 5A illustrates an embodiment in which a corridor 500 is formed through the dielectric material 226 and the apex/vertex of the dome top shape of the mesa complement structure 201, thereby exposing the electrical contact 208. The corridor 500 may be formed using any of various techniques including, without limitation, laser ablation or an etching technique. For example, the corridor 500 may be formed using an anisotropic etching technique involving an etchant that cannot penetrate the electrical contact 208, which serves as an etch stop.

In some embodiments, the corridor 500 may be formed after the reflector 224 is completely formed. For example, if the reflector 224 is not composed of any metal, the corridor 500 may be formed based on removing some of the reflector 224 along with some of the dielectric material 226 and some of the mesa complement structure 201.

Figure 5B:
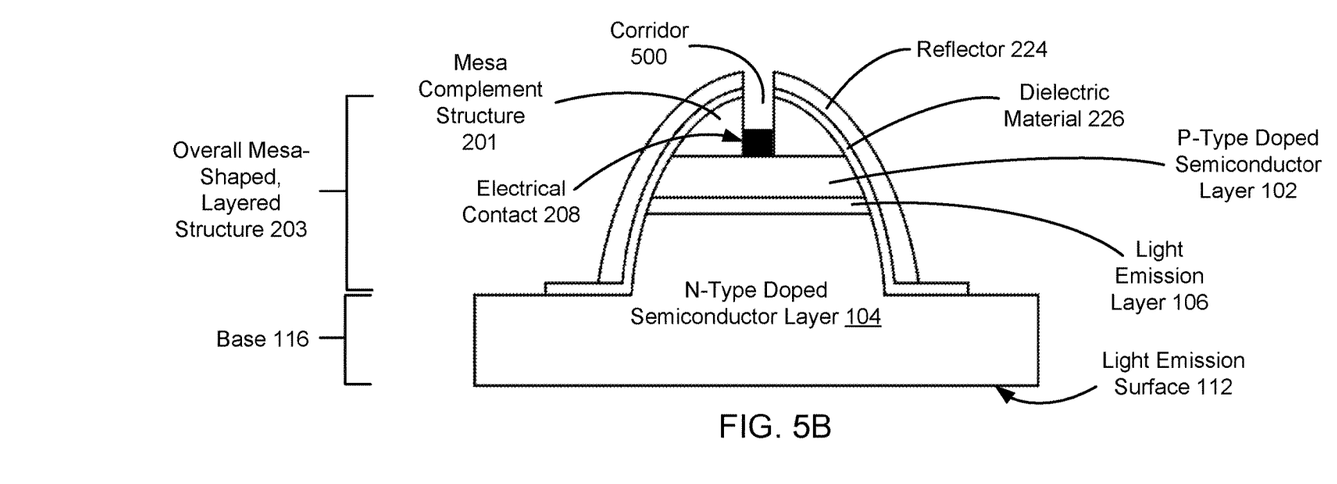

However, in some other embodiments, the corridor 500 may be formed before the reflector 224 is completely formed. FIG. 5B illustrates such an embodiment. In the example of FIG. 5B, the reflector 224 may comprise a layer of reflective material (e.g., Al or Ag) that is also a conductive material. Thus, the reflective material may be applied to the dielectric material 226 layer after the corridor 500 is formed. Since the reflective material is also a conductive material, there may be little, if any, impact on the electrical conductivity of the electrical contact 208. Furthermore, the depth of the corridor 500 may be such that little, if any, of the reflective material ever reaches the electrical contact 208.

Figure 6A:
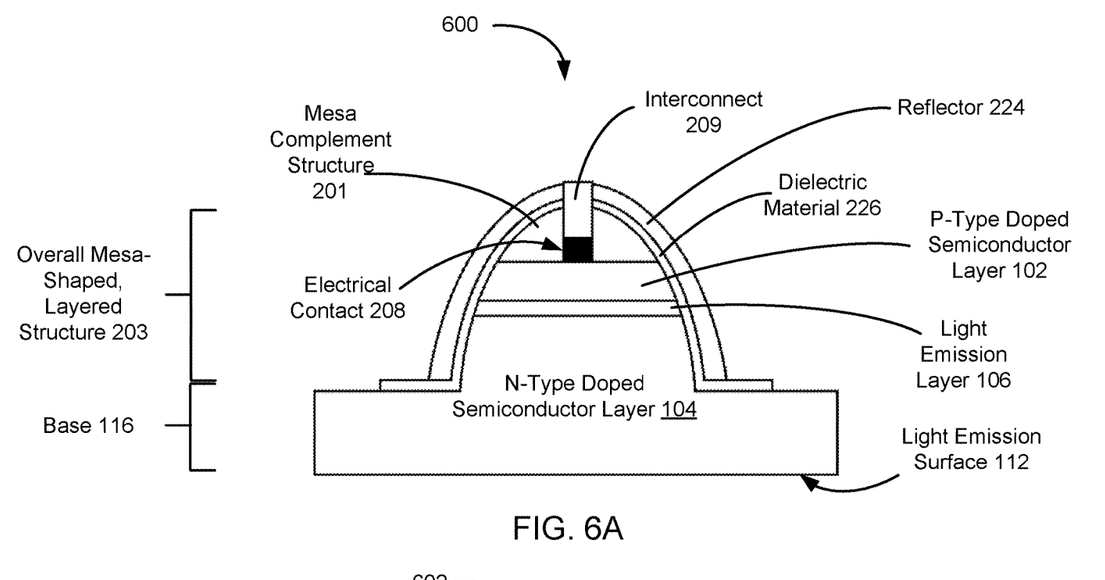
FIGS. 6A-B illustrate multiple views of an example semiconductor device having an overall mesa-shaped reflector.

To facilitate the flow of electricity to the electrical contact 208, the corridor 500 may be filled with a conductive material (e.g., gold and/or one or more other metals). Referring to FIG. 6A, this conductive material corresponds to an interconnect 209. As illustrated in the cross-sectional view 600 of FIG. 6A, if the reflector 224 comprises a conductive material, the interconnect 209 may electrically connects the reflector 224 with the electrical contact 208.

Additionally or alternatively, the interconnect 209 enables an electrical connection between the electrical contact 208 and a control circuit.

Although FIG. 6A illustrates an embodiment in which the interconnect 209 is formed after the reflector 224 is completely formed, in some other embodiments, the interconnect 209 may be formed before the reflector 224 is completely formed. For example, the reflector 224 may comprise a layer of reflective and conductive material (e.g., Al or Ag) that covers both the dielectric material 226 and the interconnect 209. Thus, application of the reflective and conductive material to the electrical contact 208 may be completely avoided.

Figure 6B:
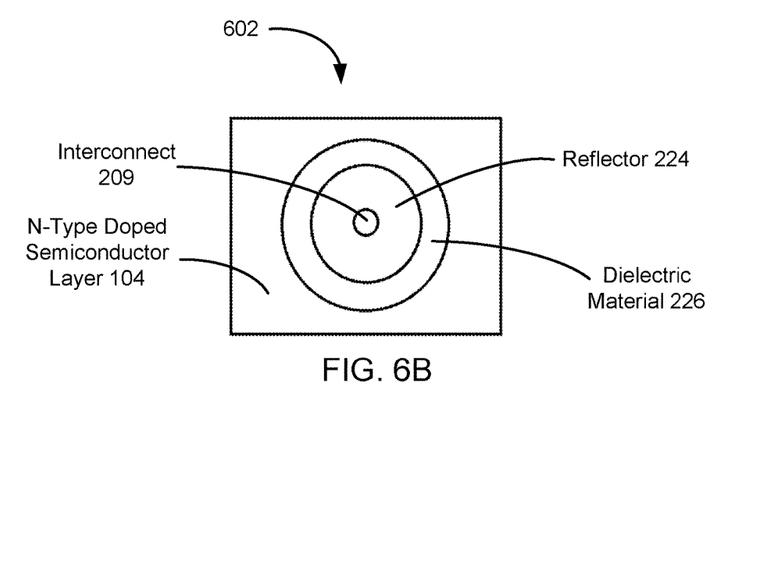

FIG. 6B illustrates a top view 602 of the microLED 200. In the example of FIG. 6B, the reflector 224 and the interconnect 209 are concentric. Thus, the interconnect 209 may occupy a hole in the reflector 224 along its longitudinal axis.

Process Overview

Figure 7:
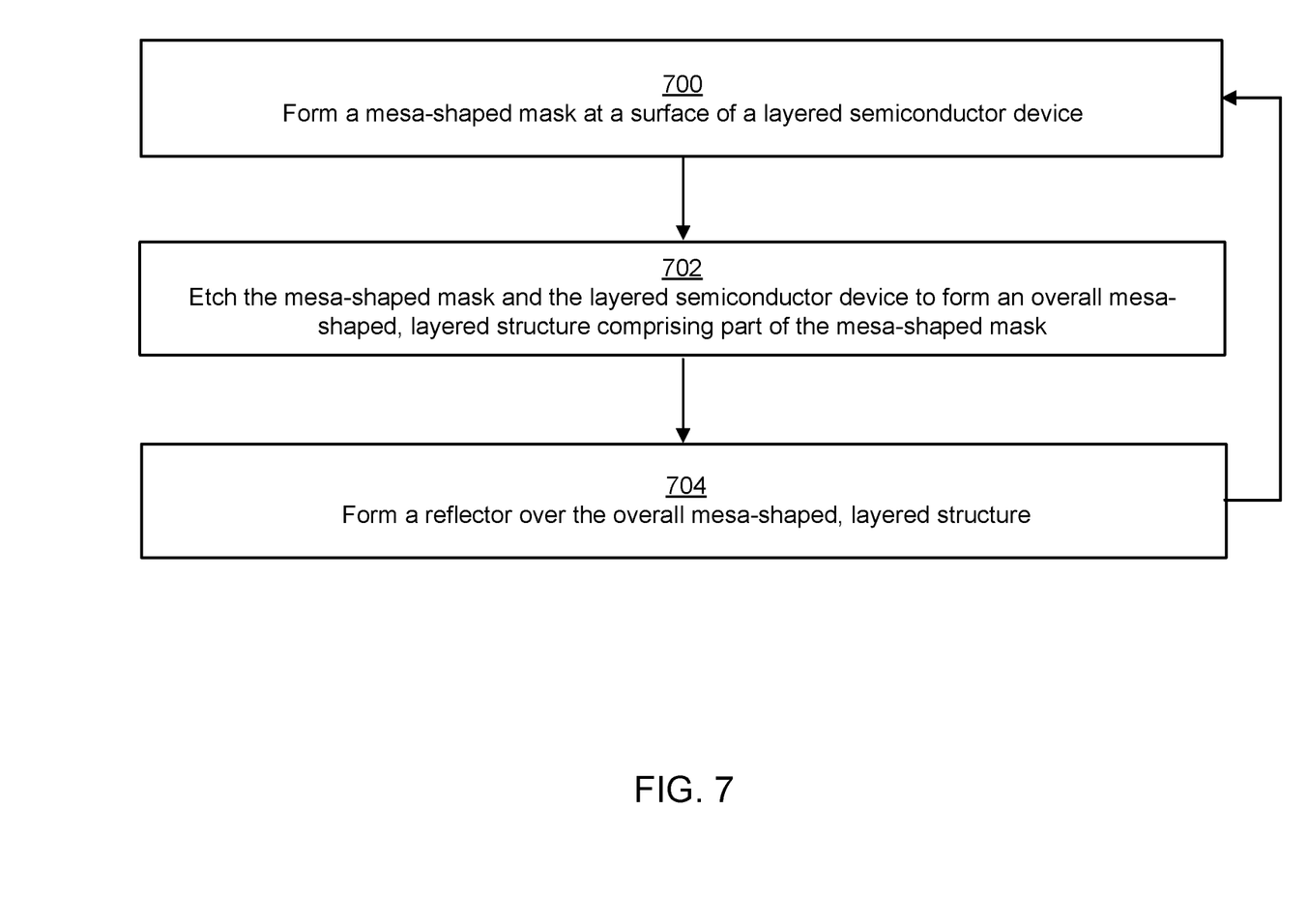
FIG. 7 is a flow diagram illustrating an example approach for forming overall mesa-shaped reflectors.

FIG. 7 is a flow diagram illustrating an example process for forming overall mesa-shaped reflectors. The example process may be performed at one or more stations for fabricating an apparatus for emitting light (e.g., an LED device). The apparatus that is fabricated may comprise a mesa complement structure, a first-type doped semiconductor, a light emission layer, a second-type doped semiconductor, and a reflector. The mesa complement structure, the first-type doped semiconductor, the light emission layer, and the second-type doped semiconductor may be arranged in layers and form an overall mesa-shaped, layered structure. In some embodiments, the overall mesa-shaped, layered structure may have a curved mesa shape, such as a paraboloid shape. In some embodiments, the first-type doped semiconductor, the light emission layer, and the second-type doped semiconductor may form a truncated mesa-shaped, layered structure that is augmented with the mesa complement structure to form the overall mesa-shaped, layered structure. The reflector may be formed on the overall mesa-shaped, layered structure and configured to collimate light that emits from the light emission layer and reaches the reflector through the mesa complement structure.

The apparatus may further comprise an electrical contact positioned at a surface of the first-type doped semiconductor. Furthermore, the apparatus may comprise an interconnect that connects the electrical contact to the reflector.

In some embodiments, the mesa complement structure may comprise a transparent dielectric material. For example, the transparent dielectric material may be a SiOx or a SiNx material.

In some embodiments, the reflector may comprise multiple layers of dielectric material. In some embodiments, the reflector may comprise a layer of Al or Ag.

At block 700, a mesa-shaped mask may be formed at a surface of a layered semiconductor device. The layered semiconductor device may comprise a first-type doped semiconductor, a light emission layer, and a second-type doped semiconductor. The light emission layer may comprise a III-Nitride semiconductor material or an AlInGaP semiconductor material.

The mesa-shaped mask may be composed of transparent dielectric material, such as a SiOx or a SiNx material. This material may server as a masking material and may be applied to the surface of the layered semiconductor device. In some embodiments, photoresist material may be applied to a surface of the masking material. In such embodiments, the photoresist material may be formed into a mesa shape, and an etching technique may be used to transfer the mesa shape of the photoresist material to the masking material, thereby forming the mesa-shaped mask.

In some embodiments, the surface of the layered semiconductor device may comprise a flat surface that accommodates an electrical contact. The electrical contact may be positioned at the surface of the layered semiconductor device prior to formation of the mesa-shaped mask.

At block 702, the mesa-shaped mask and the layered semiconductor device may be etched to form an overall mesa-shaped, layered structure. In some embodiments, the overall mesa-shaped, layered structure may have a curved mesa shape, such as a paraboloid shape. The overall mesa-shaped, layered structure may comprise a mesa complement structure and a truncated mesa-shaped, layered structure. The mesa complement structure may correspond to part of the mesa-shaped mask, and the truncated mesa-shaped, layered structure may correspond to part of the layered semiconductor device. Thus, the mesa complement structure may augment the truncated mesa-shaped, layered structure to form the overall mesa-shaped, layered structure.

At block 704, a reflector may be formed over the overall mesa-shaped, layered structure, thereby enabling collimation of light that emits from the light emission layer and reaches the reflector via the mesa complement structure. In some embodiments, the reflector may comprise multiple layers of dielectric material. In some embodiments, the reflector may comprise a layer of Al or Ag.

In some embodiments, a corridor may be etched through the mesa complement structure until the electrical contact is reached. The corridor may be etched at any time after formation of the mesa-shaped mask. In some embodiments, the corridor may be filled with a conductive material that connects the electrical contact with the reflector.

In some embodiments, block 704 may proceed to block 700 to repeat the example process of FIG. 7. Thus, one or more reflectors each having an overall mesa shape may be formed for another set of one or more light-emitting apparatuses.

System Overview

Figure 8:
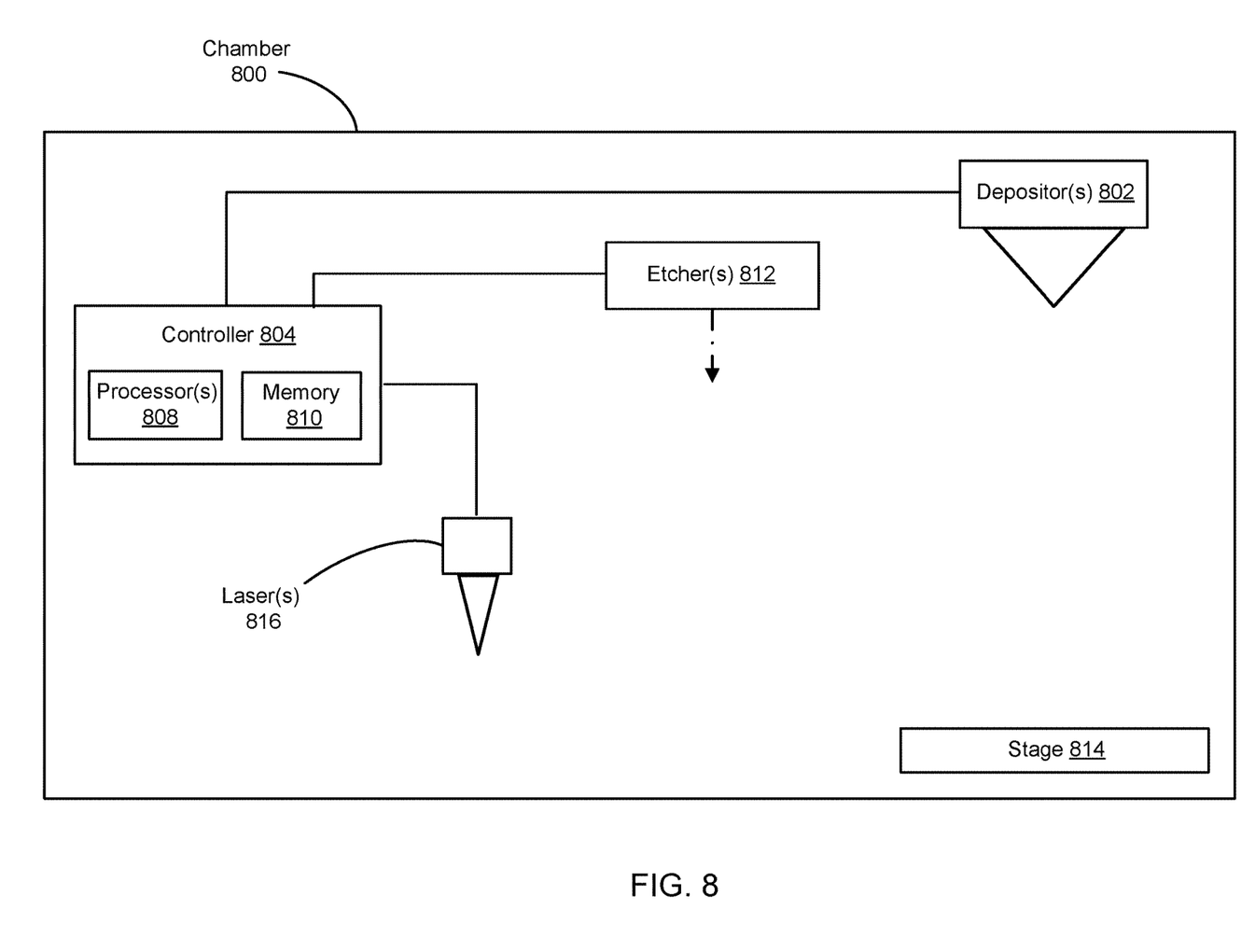
FIG. 8 illustrates an example system for forming overall mesa-shaped reflectors.

FIG. 8 illustrates an example system for forming overall mesa-shaped reflectors. The example system may comprise one or more stations for fabricating an apparatus for emitting light (e.g., an LED device). In the example of FIG. 8, the example system includes a chamber 800 that defines an interior environment for fabricating LED components. The chamber 800 may house various system components including depositor(s) 802, a controller 804, etcher(s) 812, a stage 814, and laser(s) 816. The chamber 800 may also house other system components not illustrated in FIG. 8. For example, the chamber 800 may also house a scanning electron microscope (SEM) in a high pressure atmosphere of water vapor, and the SEM may be used for positioning components and/or materials related to the fabrication of augmented reflectors.

The stage 814 may hold a fabrication substrate that supports an layered semiconductor device. The stage 814 may be movable in a variety of directions including, without limitation, up and down; left and right; and forward and back.

The depositor(s) 802 may deposit a conductive material on a surface of the layered semiconductor device, thereby forming an electrical contact. In some embodiments, the depositor(s) 802 may deposit a masking material on the surface of the layered semiconductor device. In some embodiments, the depositor(s) 802 may deposit a photoresist material on a surface of the masking material. In some embodiments, the depositor(s) 802 may deposit a dielectric material on an overall mesa-shaped, layered structure. In some embodiments, the depositor(s) 802 may deposit a conductive material on the dielectric material.

The laser(s) 816 may irradiate mesa-shaped photoresist material with ultraviolet light, thereby curing it. In some embodiments, the laser(s) 816 may be used to remove dielectric material to form a corridor that enables access to an electrical contact positioned beneath the dielectric material.

The etcher(s) 812 may etch the mesa-shaped photoresist material, the masking material, and the layered semiconductor device, thereby forming a mesa-shaped structure comprising some of the masking material and some of the layered semiconductor device. In some embodiments, the etcher(s) 812 may be used to remove dielectric material to form a corridor that enables access to an electrical contact positioned beneath the dielectric material. In some embodiments, the etcher(s) 812 may comprise a dry etcher that forms one or more etched structures based on instructions received from the controller 804. In such embodiments, the etcher(s) 812 may include gas intake and gas out-take valves, ionizing plates, and any other standard dry etching components.

The controller 804 is coupled to the depositor(s) 802 and/or etcher(s) 812 and controls the operations of the depositor(s) 802 and/or etcher(s) 812. The controller 804 may include, among other components, a memory 810 and processor(s) 808. The memory 810 stores instructions for operating the depositor(s) 802 and/or etcher(s) 812. The memory 810 may be implemented using any of a variety of volatile or non-volatile computer-readable storage media including, without limitation, SRAM, DRAM, and/or ROM. The processor(s) 808 may execute the instructions stored in the memory 810 and send instructions toward the depositor(s) 802 and/or etcher(s) 812. In some embodiments, the processor(s) 808 may execute the example process illustrated in FIG. 7.

In the example of FIG. 8, the controller 804 is also coupled to the laser(s) 816. In some embodiments, the laser(s) 816 may be used for dicing and/or performing any other technique related to fabricating LED devices.

Embodiments of the invention may include or be implemented in conjunction with an artificial reality system. Artificial reality is a form of reality that has been adjusted in some manner before presentation to a user, which may include, e.g., a virtual reality (VR), an augmented reality (AR), a mixed reality (MR), a hybrid reality, or some combination and/or derivatives thereof. Artificial reality content may include completely generated content or generated content combined with captured (e.g., real-world) content. The artificial reality content may include video, audio, haptic feedback, or some combination thereof, and any of which may be presented in a single channel or in multiple channels (such as stereo video that produces a three-dimensional effect to the viewer). Additionally, in some embodiments, artificial reality may also be associated with applications, products, accessories, services, or some combination thereof, that are used to, e.g., create content in an artificial reality and/or are otherwise used in (e.g., perform activities in) an artificial reality. The artificial reality system that provides the artificial reality content may be implemented on various platforms, including a head-mounted display (HMD) connected to a host computer system, a standalone HMD, a mobile device or computing system, or any other hardware platform capable of providing artificial reality content to one or more viewers.

The foregoing description of the embodiments of the disclosure has been presented for the purpose of illustration; it is not intended to be exhaustive or to limit the disclosure to the precise forms disclosed. Persons skilled in the relevant art can appreciate that many modifications and variations are possible in light of the above disclosure.

Some portions of this description describe the embodiments of the disclosure in terms of algorithms and symbolic representations of operations on information. These algorithmic descriptions and representations are commonly used by those skilled in the data processing arts to convey the substance of their work effectively to others skilled in the art. These operations, while described functionally, computationally, or logically, are understood to be implemented by computer programs or equivalent electrical circuits, microcode, or the like. Furthermore, it has also proven convenient at times, to refer to these arrangements of operations as modules, without loss of generality. The described operations and their associated modules may be embodied in software, firmware, and/or hardware.

Steps, operations, or processes described may be performed or implemented with one or more hardware or software modules, alone or in combination with other devices. In some embodiments, a software module is implemented with a computer program product comprising a computer-readable medium containing computer program code, which can be executed by a computer processor for performing any or all of the steps, operations, or processes described.

Embodiments of the disclosure may also relate to an apparatus for performing the operations described. The apparatus may be specially constructed for the required purposes, and/or it may comprise a general-purpose computing device selectively activated or reconfigured by a computer program stored in the computer. Such a computer program may be stored in a non-transitory, tangible computer readable storage medium, or any type of media suitable for storing electronic instructions, which may be coupled to a computer system bus. Furthermore, any computing systems referred to in the specification may include a single processor or may be architectures employing multiple processor designs for increased computing capability.

Embodiments of the disclosure may also relate to a product that is produced by a computing process described herein. Such a product may comprise information resulting from a computing process, where the information is stored on a non-transitory, tangible computer readable storage medium and may include any embodiment of a computer program product or other data combination described herein.

The language used in the specification has been principally selected for readability and instructional purposes, and it may not have been selected to delineate or circumscribe the inventive subject matter. It is therefore intended that the scope of the disclosure be limited not by this detailed description, but rather by any claims that issue on an application based hereon. Accordingly, the disclosure of the embodiments is intended to be illustrative, but not limiting, of the scope of the disclosure, which is set forth in the following claims.

What is claimed is:
1. An apparatus for emitting light, comprising:
a mesa complement structure;
a first-type doped semiconductor;
a light emission layer;
a second-type doped semiconductor; and
a reflector, wherein the mesa complement structure, the first-type doped semiconductor, the light emission layer, and the second-type doped semiconductor are arranged in layers and form an overall mesa-shaped, layered structure, and wherein the reflector is formed on the overall mesa-shaped, layered structure and configured to collimate light that emits from the light emission layer and reaches the reflector through the mesa complement structure.

2. The apparatus of claim 1, wherein the mesa complement structure, the first-type doped semiconductor, the light emission layer, and the second-type doped semiconductor are etched together to form the overall mesa-shaped, layered structure.

3. The apparatus of claim 1, wherein the mesa complement structure comprises a transparent dielectric material.

4. The apparatus of claim 3, wherein the transparent dielectric material is a silicon oxide or a silicon nitride material.

5. The apparatus of claim 1, wherein the overall mesa-shaped, layered structure has a curved mesa shape.

6. The apparatus of claim 5, wherein the curved mesa shape is a paraboloid shape.

7. The apparatus of claim 1, wherein the reflector comprises multiple layers of dielectric material.

8. The apparatus of claim 1, wherein the reflector comprises a layer of aluminum or silver.

9. The apparatus of claim 1, further comprising:
an electrical contact positioned at a surface of the first-type doped semiconductor; and
an interconnect that connects the electrical contact to the reflector.

10. The apparatus of claim 1, wherein the light emission layer comprises a III-Nitride semiconductor material.

11. The apparatus of claim 1, wherein the light emission layer comprises an aluminum indium gallium phosphide semiconductor material.

12. The apparatus of claim 1, wherein the first-type doped semiconductor, the light emission layer, and the second-type doped semiconductor form a truncated mesa-shaped, layered structure that is augmented with the mesa complement structure to form the overall mesa-shaped, layered structure.

13. A method, comprising:
forming a mesa-shaped mask at a surface of a layered semiconductor device, wherein the layered semiconductor device comprises a first-type doped semiconductor, a light emission layer, and a second-type doped semiconductor;
etching the mesa-shaped mask and the layered semiconductor device to form an overall mesa-shaped, layered structure, wherein the overall mesa-shaped, layered structure comprises a mesa complement structure and a truncated mesa-shaped, layered structure, wherein the mesa complement structure corresponds to part of the mesa-shaped mask, wherein the truncated mesa-shaped, layered structure corresponds to part of the layered semiconductor device, and wherein the mesa complement structure augments the truncated mesa-shaped, layered structure to form the overall mesa-shaped, layered structure; and
forming a reflector over the overall mesa-shaped, layered structure, thereby enabling collimation of light that emits from the light emission layer and reaches the reflector through the mesa complement structure.

14. The method of claim 13, wherein the mesa-shaped mask is composed of a transparent dielectric material.

15. The method of claim 13, wherein the overall mesa-shaped, layered structure has a paraboloid shape.

16. The method of claim 13, wherein the surface of the layered semiconductor device comprises a flat surface that accommodates an electrical contact.

17. The method of claim 13, wherein forming the mesa-shaped mask comprises:
applying masking material to the surface of the layered semiconductor device;
applying photoresist material to a surface of the masking material;
forming the photoresist material into a mesa shape; and
using an etching technique to transfer the mesa shape of the photoresist material to the masking material, thereby forming the mesa-shaped mask.

18. The method of claim 13, further comprising:
prior to forming the mesa-shaped mask, positioning an electrical contact at the surface of the layered semiconductor device;
after forming the mesa-shaped mask, etching a corridor through the mesa complement structure until the electrical contact is reached; and
filling the corridor with a conductive material that connects the electrical contact with the reflector.

19. The method of claim 13, wherein the mesa-shaped mask is composed of a silicon oxide or a silicon nitride material.

20. An apparatus fabricated by a method comprising:
forming a mesa-shaped mask at a surface of a layered semiconductor device, wherein the layered semiconductor device comprises a first-type doped semiconductor, a light emission layer, and a second-type doped semiconductor;
etching the mesa-shaped mask and the layered semiconductor device to form an overall mesa-shaped, layered structure, wherein the overall mesa-shaped, layered structure comprises a mesa complement structure and a truncated mesa-shaped, layered structure, wherein the mesa complement structure corresponds to part of the mesa-shaped mask, wherein the truncated mesa-shaped, layered structure corresponds to part of the layered semiconductor device, and wherein the mesa complement structure augments the truncated mesa-shaped, layered structure to form the overall mesa-shaped, layered structure; and
forming a reflector over the overall mesa-shaped, layered structure, thereby enabling collimation of light that emits from the light emission layer and reaches the reflector through the mesa complement structure.

* * * * *